United States Patent

Lin et al.

[11] Patent Number: 6,084,240
[45] Date of Patent: Jul. 4, 2000

[54] ION IMPLANTER

[75] Inventors: Chien-Hsing Lin, Taipei; Cheng-Tai Peng, Hsinchu, both of Taiwan

[73] Assignee: United Integrated Circuits Corp., Hsinchu, Taiwan

[21] Appl. No.: 09/136,580

[22] Filed: Aug. 19, 1998

[30] Foreign Application Priority Data

Jun. 20, 1998 [TW] Taiwan ................................. 87109959

[51] Int. Cl.$^7$ ...................................................... H01J 37/20

[52] U.S. Cl. ......................................................... 250/443.1

[58] Field of Search ............................ 250/443.1, 492.21

[56] References Cited

U.S. PATENT DOCUMENTS

| 4,419,584 | 12/1983 | Benveniste | 250/443.1 |
| 4,812,663 | 3/1989 | Douglas-Hamilton et al. | 250/443.1 |
| 5,126,571 | 6/1992 | Sakai | 250/443.1 |
| 5,753,923 | 5/1998 | Mera et al. | 750/443.1 |

*Primary Examiner*—Kiet T. Nguyen
*Attorney, Agent, or Firm*—Thomas, Kayden, Horstemeyer & Risley

[57] ABSTRACT

A temperature monitor is included inside an ion implanting chamber to constantly monitor the wafer temperature during ion implantation. The measured temperature signal is sent to a central control system through an interface circuit. When an abnormal temperature is detected, the central control system automatically ceases the ion implantation operation and triggers an alarm for operators.

15 Claims, 2 Drawing Sheets

ION IMPLANTER

CROSS-REFERENCE TO RELATED APPLICATION

This application claims the priority benefit of Taiwan application serial no. 87109959, filed Jun. 20, 1998, the full disclosure of which is incorporated herein by reference.

BACKGROUND OF THE INVENTION

1. Field of the Invention

This invention relates to an ion implanter, and more particularly to an ion implanting chamber of the ion implanter with a temperature monitor.

2. Description of Related Art

As the integration of an integrated circuit (IC) rises, precise IC fabrication becomes more essential. This is because any little error in IC fabrication may cause an IC fabrication failure. A subsequent undesired result of such failure is that a lot of wafers may be partially or fully damaged and therefore the fabrication cost increases.

Currently, ion implantation technology can provide a doping process in IC fabrication. Because doping distribution can be more precisely controlled by ion implantation technology than by a thermal diffusion technology,, especially with regard to the depth and dopant density profile, ion implantation becomes the main doping technology in very large scale integration (VLSI) fabrication for IC devices.

An ion implanter used for ion implantation is a complicated piece of equipment with a huge volume. The ion implanter is distinguished according to its potential dopant density, either as a high current type with about 10 mA of ion beam or a medium current type with about 1 mA of ion beam. An ion beam like a particle line is composed of a large number of ion particles in close proximity to each other and continuously travelling together so that dopant density is expressed in the current unit. Since the cross-sectional beam size is tiny, an ion beam scanner is needed to fully dope an entire semiconductor wafer with two-dimensional large regions.

The available ion beam scanners are basically divided into two categories: an electronic type of scan plates design and a mechanical type of spin disk design.

For the scan plates type scanner, the ion beam travels in between two pairs of parallel plates. The parallel plates produce an electric field transverse to the beam direction to deflect the ion beam so that the two pairs of parallel plates can two-dimensionally deflect the ion beam to the desired places to perform a scan on the fixed wafer. Theoretically, the scan plates type scanner makes use of deflection on the ion beam to dope the wafer in the desired region.

For the spin disk type scanner, the operation is on the contrary to the scan plates type. The ion beam direction is fixed but the wafer location is moving to get wafer doped. There are many wafers mounted on a spin disk plate. When doping is performed, the spin disk plate not only fast rotates but also moves following a special track so that the wafers on the spin disk pate can be uniformly doped.

Regardless of whether the machine is a scan plates scanner or a spin disk scanner, the doping is always performed in an ion implanting chamber. FIG. 1 is schematic for a conventional ion implanter chamber. The ion implanting chamber shown in FIG. 1 is used in an ion implanter with a spin disk scanner, for example, the E500HP™ or VII-SION80™ provided by the VARIAN company. In FIG. 1, inside an ion implanting chamber 10, an ion beam 18 is produced by the ion implanter and shoots onto a number of wafers 14, which are mounted on a wafer mounting disk 12 in circular sequence. The wafer mounting disk 12 is mounted on a motor 16, which is cooled by a cooling system 20. The motor 16 can rotate the wafer mounting disk 12 and the wafer mounting disk 12 can be moved up and down so that the wafers 14 on the wafer mounting disk 12 can be uniformly doped. The ion implanting chamber 10 is also used for an ion implanter with the scan plates scanner, in which the ion beam 18 moves but the wafer-mounting plate 12 does not move.

When the ion beam 18 is doping the wafers 14, the ion energy of about 10–200 KeV causes the wafers 14 to rise in temperature. The high temperature can change the properties of a photoresist (not shown) formed on the wafers. As a result, for example, junction depth and dopant density are not controlled as desired, which causes a fabrication failure. In order to prevent the deterioration of the photoresist from ion implantation, the currently available ion implanter includes the cooling system 20 to cool the wafers 14. However, the cooling system 20 only indirectly cools the wafers 14 through the wafer mounting disk 12 so that the real temperature on the wafers 14 cannot be precisely monitored. In this case, a high rise in temperature on the wafers 14 would cause fabrication failure.

Currently, the temperature measurement is taken only at a testing stage, by tagging a temperature tag (not shown) on the surface of a control wafer, which is like the wafers 14 but for control test only. The temperature of the control wafer is obtained by observing the color change of the temperature tag. This kind of temperature measurement has the following several drawbacks:

1. It is only suitable for the control wafer because the temperature tag is never tagged on the wafers 14 in real fabrication.
2. The temperature measurement process is not convenient because it is necessary to place the temperature tag and observe it by eye.
3. The temperature of the wafers 14 in actual fabrication cannot be measured.
4. The temperature measurement taken with the temperature tag is not sufficiently precise.

SUMMARY OF THE INVENTION

It is therefore an objective of the present invention to provide an ion implanting chamber with a temperature monitor, which can directly monitor temperature of a wafer during ion implantation.

It is another an objective of the present invention to provide an ion implanting chamber with a temperature monitor, which can constantly monitor temperature of a wafer.

In accordance with the foregoing and other objectives of the present invention, an ion implanting chamber used in an ion implanter at least includes a wafer mounting disk to mount a wafer and a temperature monitor to monitor temperature of the wafer during ion implantation.

The temperature monitor is included inside the ion implanting chamber to constantly monitor the wafer temperature during ion implantation. The measured temperature signal is sent to a central control system through an interface circuit. When an abnormal temperature is detected, the central control system automatically ceases the ion implantation operation and triggers an alarm for operators.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
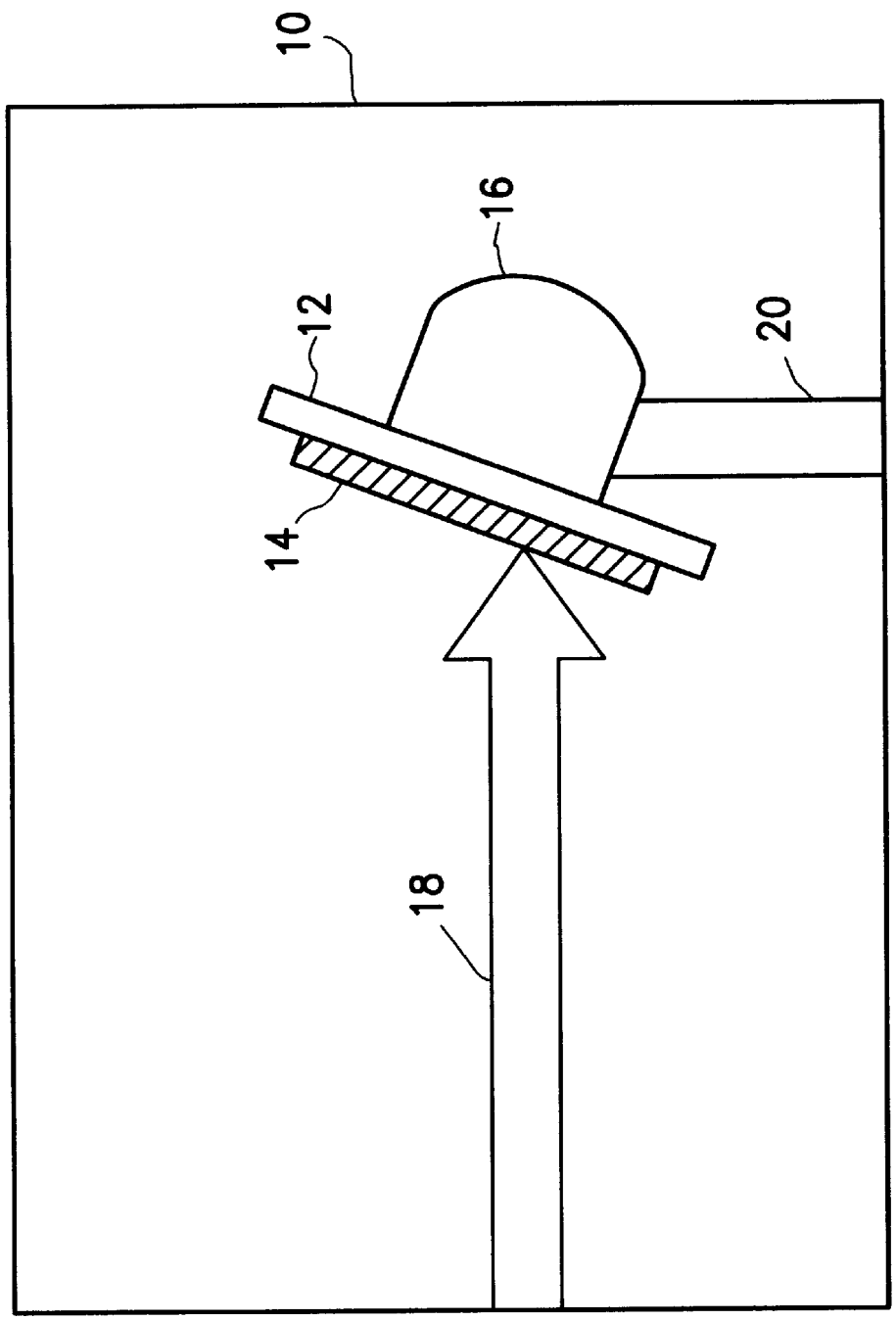
FIG. 1 is schematic for a conventional ion implanter chamber.
Figure 2:
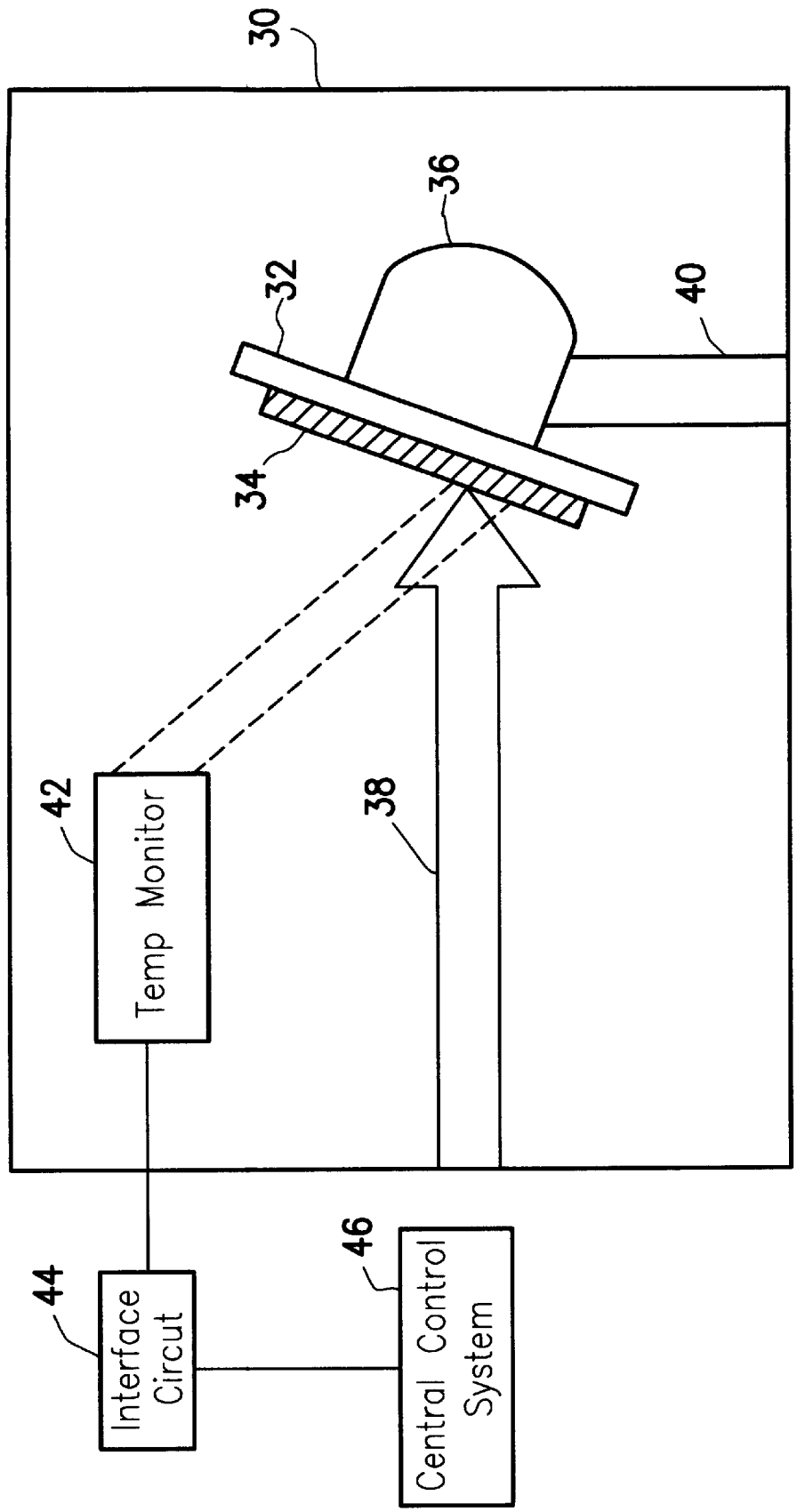
FIG. 2 is schematic for an ion implanter chamber, according to a preferred embodiment of the invention.

An ion implanter of, for example, the E500HP or VII-SION80 provided by the VARIAN company, is a spin disk type. FIG. 2 is schematic for an ion implanter chamber used in the ion implanter, according to a preferred embodiment of the invention. In FIG. 2, an ion implanter chamber 30 includes a wafer mounting disk 32 to mount a wafer 34. The wafer mounting disk 32 is mounted on a motor 36 and is rotated by the motor 36. The wafer mounting disk 32 can be also moved up and down. Thus the wafer 34 on the wafer mounting disk 32 can be uniformly doped.

As an ion implantation process is performed, an ion beam 38 bombards the wafer 34 with a large number of energetic ions, which induce a high temperature in the wafer 34. The high temperature of the wafer 34 can change properties of a photoresist (not shown) formed on the wafer 34. As a result, for example, a junction depth and a dopant density are not controlled as desired, which causes a fabrication failure. In order to prevent the deterioration of the photoresist due to ion implantation, a cooling system 40 is used to cool down the wafer 34.

The ion implanting chamber 30 is also used for an ion implanter with the scan plates scanner, in which the ion beam 38 moves but the wafer-mounting plate 32 is stationary.

The temperature of the wafer 34 is monitored by a temperature monitor 42, which is located inside the ion implanting chamber 30. The temperature monitor 42 utilizes, for example, an infrared thermometer to measure the temperature of the wafer 34 during ion implantation. The measured temperature quantity is, for example, an electronic signal, which is sent to an interface circuit 44, such as an input/output (I/O) circuit, and then is sent to a central control system 46, which records and analyzes temperature signals. The electronic signal indicates the temperature of the wafer 34. If an abnormal temperature signal is detected, the central control system 46 then automatically ceases the ion implantation operation and triggers an alarm. Thus ion implantation can be performed well.

In conclusion, the ion implanting chamber has the following characteristics:

1. The temperature monitor 42 is included inside the ion implanting chamber 30 to constantly monitor the temperature of the wafer 34 during ion implantation.
2. The interface circuit 44 is included to receive the temperature signal and output the temperature signal to the central control system 46. When an abnormal temperature is detected, the central control system 46 automatically ceases the ion implantation operation and triggers an alarm. Thus ion implantation can be performed well.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An ion implanting chamber used in an ion implanter, the ion implanting chamber comprising:
    a wafer mounting disk to mount a wafer; and
    a temperature monitor to measure a signal during implantation of ions in the wafer, wherein the measured signal indicates a temperature of the wafer which is currently implanted.

2. The ion implanting chamber of claim 1, wherein the ion implanting chamber further comprises:
    a motor to rotate the wafer mounting disk; and
    a cooling system to cool the wafer through the wafer mounting disk.

3. The ion implanting chamber of claim 1, wherein the ion implanter further comprises:
    an interface circuit, coupled to the temperature monitor to receive the measured signal from the temperature monitor; and
    a central control system, coupled to the interface circuit to receive the measured signal passed by the interface circuit wherein the central control system processes the measured signal to obtain the wafer temperature, and if the wafer temperature is abnormal, the central control system then automatically ceases performance of ion implantation and triggers an alarm.

4. The ion implanting chamber of claim 3, wherein the interface circuit comprises an input/output (I/O) circuit.

5. The ion implanting chamber of claim 1, wherein the temperature monitor comprises an infrared thermometer.

6. The ion implanting chamber of claim 1, wherein the ion implanter is a type of scan plate design.

7. The ion implanting chamber of claim 1, wherein the ion implanter is a type of spin disk design.

8. An ion implanting chamber used in an ion implanter, the ion implanting chamber comprising:
    a wafer mounting disk to mount a wafer;
    a temperature monitor to measure a signal while implanting ions on the wafer, wherein the measured signal indicates a temperature on the wafer which is currently implanted; and
    a cooling system to cool the wafer through the wafer mounting disk.

9. The ion implanting chamber of claim 8, wherein the wafer mounting disk is movable on a special track.

10. The ion implanting chamber of claim 9, wherein the ion implanting chamber comprises a motor to rotate the wafer mounting disk.

11. The ion implanting chamber of claim 8, wherein the ion implanter further comprises:
    an interface circuit, coupled to the temperature monitor to receive the measured signal from the temperature monitor; and
    a central control system, coupled to the interface circuit to receive the measured signal passed by the interface circuit, wherein the central control system processes the measured signal to obtain the wafer temperature, and if the wafer temperature is abnormal, the central control system then automatically ceases performance of ion implantation and triggers an alarm.

12. The ion implanting chamber of claim 11, wherein the interface circuit comprises an input/output (I/O) circuit.

13. The ion implanting chamber of claim 11, wherein the temperature monitor comprises an infrared thermometer.

14. The ion implanting chamber of claim 8, wherein the ion implanter is a type of scan plate design.

15. The ion implanting chamber of claim 8, wherein the ion implanter is a type of spin disk design.

* * * * *